United States Patent [19]
Castellucci

[11] Patent Number: 5,541,545
[45] Date of Patent: Jul. 30, 1996

[54] HIGH SPEED BIPOLAR D LATCH CIRCUIT WITH REDUCED LATCH CLOCKING OUTPUT CORRUPTION

[75] Inventor: Gregg R. Castellucci, Plattsburgh, N.Y.

[73] Assignee: International Business Machines Corporation, Armonk, N.Y.

[21] Appl. No.: 486,327

[22] Filed: Jun. 7, 1995

[51] Int. Cl.$^6$ ............................. H03K 3/037; H03K 3/26
[52] U.S. Cl. ...................... 327/218; 327/222; 327/212; 327/202
[58] Field of Search ................................. 327/215, 218, 327/219, 222, 223, 202, 203, 204, 208, 211, 212

[56] References Cited

U.S. PATENT DOCUMENTS

| | | | |
|---|---|---|---|
| 3,459,974 | 8/1969 | May | 327/222 |
| 3,814,953 | 6/1974 | Malaviya | 327/115 |
| 4,237,387 | 12/1980 | Devendorf et al. | 327/223 |
| 4,270,062 | 5/1981 | Hanna | 327/202 |
| 4,276,488 | 6/1981 | Benedict et al. | 327/202 |
| 4,622,475 | 11/1986 | Whiteley | 327/223 |
| 4,626,706 | 12/1986 | Allen et al. | 327/204 |
| 4,628,216 | 12/1986 | Mazumder | 326/126 |
| 4,686,394 | 8/1987 | Lam | 326/126 |
| 4,727,265 | 2/1988 | Nanbu et al. | 326/89 |
| 4,755,693 | 7/1988 | Suzuki et al. | 327/590 |
| 4,777,388 | 10/1988 | Widener | 327/202 |
| 4,779,009 | 10/1988 | Tsunoi et al. | 327/202 |
| 4,823,028 | 4/1989 | Lloyd | 327/64 |
| 4,825,097 | 4/1989 | Bazil et al. | 327/204 |
| 4,853,899 | 8/1989 | Kitsukawa et al. | 365/207 |
| 4,864,540 | 9/1989 | Hashemi et al. | 365/179 |
| 4,866,674 | 9/1989 | Tran | 365/189.11 |
| 4,891,531 | 1/1990 | Kobayashi et al. | 327/187 |
| 4,939,693 | 7/1990 | Tran | 365/190 |
| 4,940,905 | 7/1990 | Kobayashi et al. | 327/187 |
| 4,943,741 | 7/1990 | Estrada et al. | 327/223 |
| 4,975,595 | 12/1990 | Roberts et al. | 327/218 |
| 4,980,579 | 12/1990 | McDonald et al. | 326/89 |
| 4,996,445 | 2/1991 | Lin | 327/198 |
| 5,001,361 | 3/1991 | Tamamura et al. | 327/223 |
| 5,041,743 | 8/1991 | Matsumoto | 326/89 |
| 5,043,939 | 8/1991 | Slamowitz et al. | 365/154 |
| 5,200,650 | 4/1993 | Cowley et al. | 327/223 |

Primary Examiner—Timothy P. Callahan
Assistant Examiner—My-Trang Nu Ton
Attorney, Agent, or Firm—Calfee Halter & Griswold

[57] ABSTRACT

A high speed bi-polar D latch circuit uses cross-coupled current-biased buffering transistors to block control current from output resistors so that the clock and data controls are not connected directly to the outputs of the latch. The memory cell portion of the latch which controls the latch output is constantly biased. Latch output swing is minimally affected by clock/data switching due to the buffering action of the emitter followers on the latch outputs. Changing the latch state is accomplished by changing the base-emitter voltage of the buffering transistors through the emitter followers. The circuit provides greater noise immunity at latch outputs during clock transitions and faster rise/fall times of output waveforms.

3 Claims, 3 Drawing Sheets

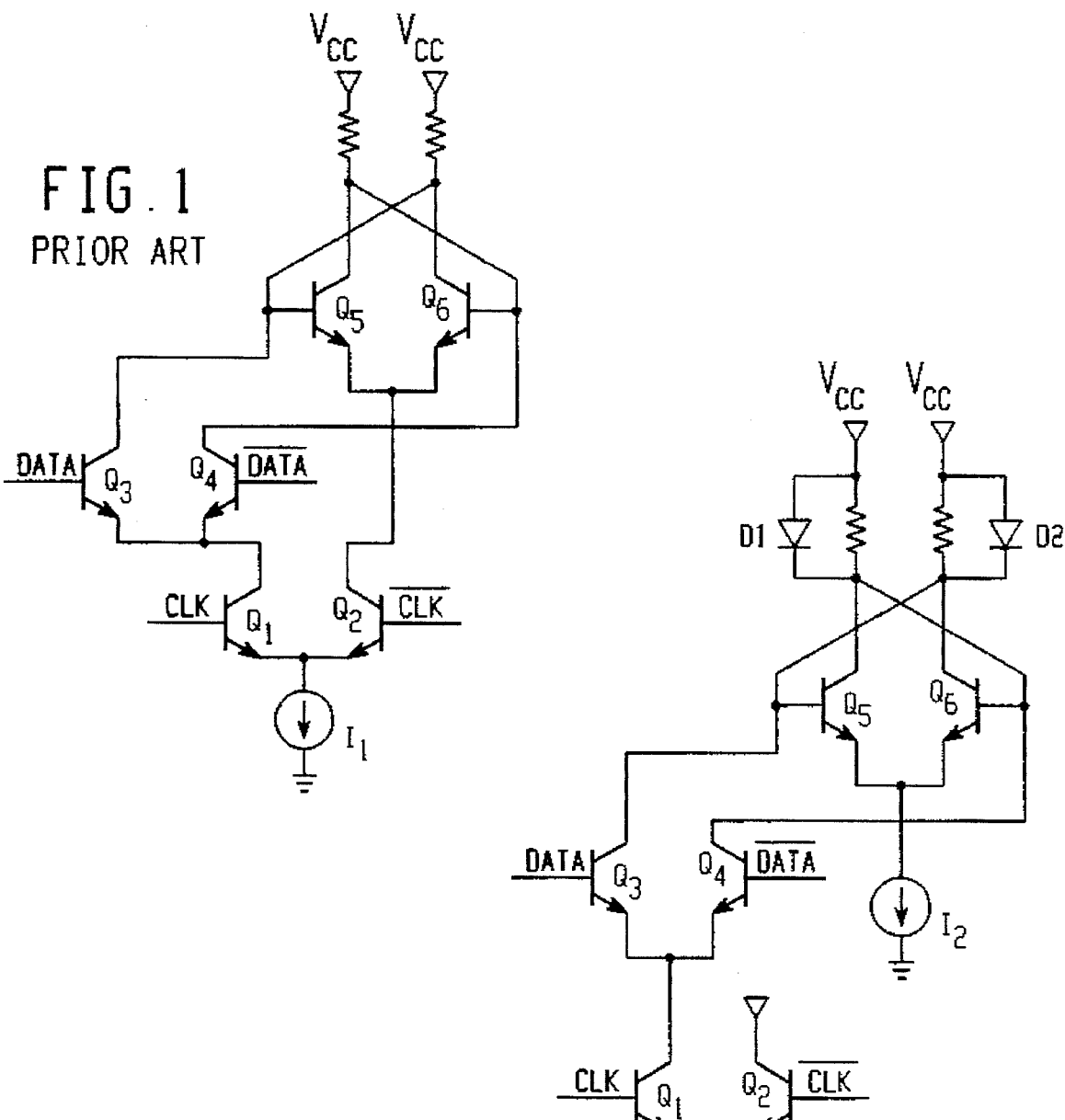

HIGH SPEED BIPOLAR D LATCH CIRCUIT WITH REDUCED LATCH CLOCKING OUTPUT CORRUPTION

FIELD OF THE INVENTION

The present invention is in the field of electronic logic circuits and, more particularly, to D-type flip-flop integrated latch circuits formed on monolithic semiconductor chips for reading and writing electronic data.

BACKGROUND OF THE INVENTION

High speed bipolar D latches, such as ECL master-slave flip-flop circuits of the type used in integrated circuit memory devices, transfer binary information existing at the inputs of the master portion to the slave portion thereof in response to a predetermined transitions of a clock signal. This data is stored in and provided at the output terminals of the flip-flop by the slave portion until the next predetermined transition of the clock signal, at which time the data then being supplied to the input terminals of the master portion is stored in the slave portion of the circuit.

High speed bipolar current switches have an undesirable performance characteristic in that the differential output voltage of the latch is reduced upon latch clock transitions which can cause problems with downstream circuitry.

FIG. 1 illustrates a typical high speed bipolar D latch. Q1 and Q2 make up the clocking portion of the latch. Q5 and Q6 make up the memory cell portion of the latch. Q3 and Q4 make up the data input portion of the latch. Clocking of the latch determines which pair of transistors controls the outputs; Q3/Q4 with clock high; Q5/Q6 with clock low. As shown in FIG. 1A, on clock transitions there is an undesirable momentary reduction of latch output voltage as Q3/Q4 and Q5/Q6 turn on and off as the current path from I1 switches between the transistor pairs.

FIG. 2 illustrates a variation of the D latch of FIG. 1 which partially solves the problems associated with clock edge transitions. The memory cell portion of the latch is constantly biased and as a result the output voltages to the first order are not affected by clock transitions. One disadvantage of this circuit is the use of clamp diodes D1 and D2 which slow the operation of the latch. Another disadvantage is that the output voltage swing will vary depending on the clock phase since the clock and data portions of the latch are tied directly to the output.

SUMMARY OF THE INVENTION

The present invention overcomes these and other disadvantages of the prior art by providing a high speed bipolar D latch circuit which eliminates output fluctuations which occur during clock transition times. The circuit of the invention provides an improved speed/power product by eliminating the use of swing clamp diodes so that the clocking/data portions are not tied directly to the outputs of the latch. The memory cell portion of the latch which controls the latch output is constantly biased. The latch output swing is minimally affected by clock/data switching due to the buffering action of the emitter followers on the latch outputs. Changing of the latch state is accomplished by changing the base-emitter voltage Q5/Q6 through the emitter follower and R5/R6. The latch thus has greater noise immunity at latch outputs during clock transitions, and faster rise and fall times of output waveforms.

In accordance with one aspect of the invention, a high speed bi-polar D latch is provided in which the clock/data portion are not tied directly to the outputs of the latch. The memory cell portion of the latch which controls the latch output is constantly biased. The latch output swing is minimally affected by clock/data switching due to the buffering action of the emitter followers on the latch outputs. Clamp diodes are not necessary. Changing the latch state is accomplished by changing the base-emitter voltage of the buffering transistors through the emitter followers. The circuit provides greater noise immunity at latch outputs during clock transitions and faster rise/fall times of output waveforms.

The invention which overcomes the disadvantages of the prior art is now described in particularized detail with reference to FIGS. 3 through 5.

BRIEF DESCRIPTION OF THE FIGURES

In the Figures:

FIG. 1 is a schematic diagram of a latch circuit of the prior art;

FIG. 1A is a timing chart of signals of the circuit of FIG. 1;

FIG. 2 is a schematic diagram of another latch circuit of the prior art;

DETAILED DESCRIPTION OF PREFERRED EMBODIMENTS

Figure 3:
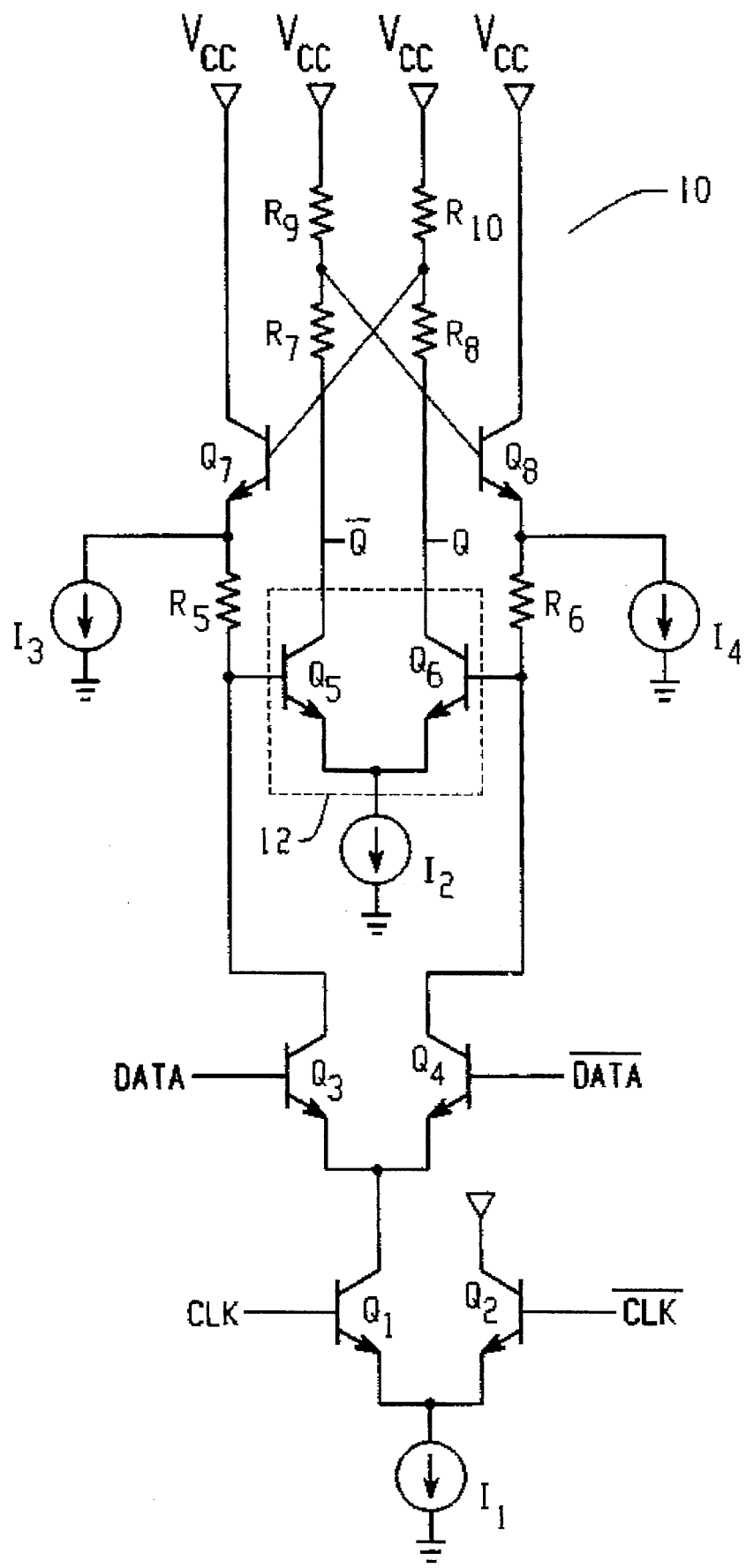
FIG. 3 is a schematic diagram of the latch circuit of the present invention as incorporated into a memory cell circuit of the present invention.

FIG. 3 schematically illustrates a high speed bipolar D latch circuit 10 which uses emitter-coupled logic. A set of transistors Q1 and Q2 make up the clocking portion of the latch, transistors Q3 and Q4 provide a data input port, and transistors Q5 and Q6 provide the memory cell portion Of the latch. Emitter followers of output buffering transistors Q7 and Q8 are biased by constant current sources I3, and I4 and corresponding resistors R5 and R6 bias the differential slave flip-flop. Emitter-coupled memory cell transistors Q5 and Q6 are biased by a constant current source I2 so that the memory cell portion of the latch which controls the latch output is constantly biased.

Buffering transistors Q7 and Q8 block the control current I1 from the output resistors R9 and R10. Without the buffering transistors Q7 and Q8, then during a clock cycle the total current through R9/R10 would be I1+I2, thereby causing a larger voltage drop across R7/R8. The use of transistors Q7 and Q8 to perform the buffering function overcomes the speed-compromising use of clamp diodes.

Figure 4:
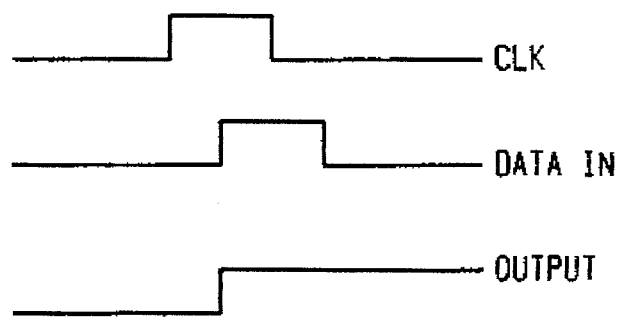
FIG. 4 is a timing diagram of the clock, data in, and output signals of the circuit of FIG. 3.

By this arrangement, the clocking and data portions of the circuit are not tied directly to the outputs of the latch. The memory cell portion of the latch which controls the latch output is constantly biased. As shown in FIG. 4, the latch output voltage swing is minimally affected by clock/data switching because of the buffering action of the emitter followers on the latch outputs. Clamp diodes are not necessary. Changing of latch state is accomplished by changing the base-emitter voltage of transistors Q5 and Q6 through the emitter followers and R5 and R6. I3 and I4 are necessary to keep the emitter followers biased, regardless of the state of memory cell transistors Q5 and Q6.

Figure 5:
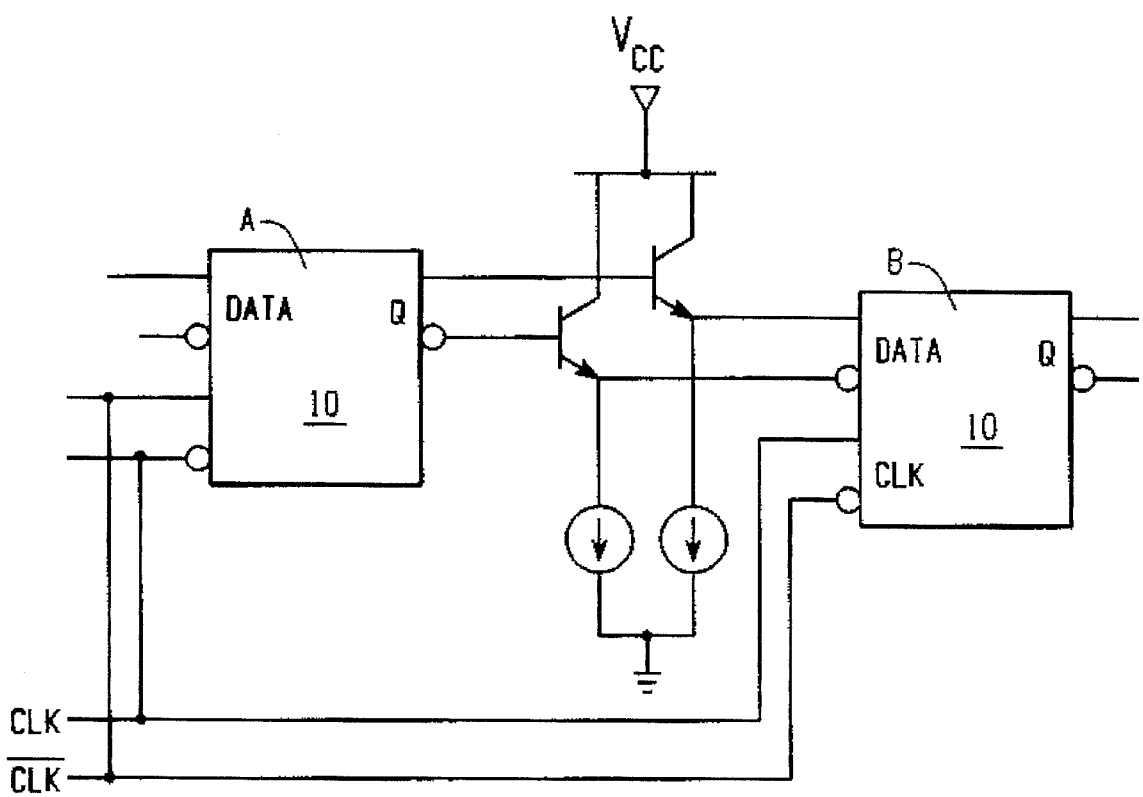
FIG. 5 is a schematic diagram of a master-slave flip flop circuit embodying the latch circuit of the present invention.

FIG. 5 schematically illustrates a master-slave flip-flop circuit in which the D latch of the present invention may be used. As wired, phase inversion from latch A to latch B upon clock transitions provides the master-slave flip-flop dat storage operation.

Although the invention has been described with respect to certain preferred embodiments, other applications of the basic principles of the invention which may be apparent to those of skill in the art are all within the scope of the invention as defined by the accompanying claims.

What is claimed is:

1. A latch circuit for receiving and holding data and producing a data output signal, the latch circuit comprising:

first and second memory cell transistors each having collector, base and emitter terminals, the emitters of the first and second memory cell transistors commonly connected to a first constant current source;

collector terminals of the memory cell transistors each connected to a voltage source through a resistor;

first and second buffering transistors each having collector, base and emitter terminals;

collector terminals of the buffering transistors connected to the voltage source;

a base terminal of the first buffering transistor connected to a collector terminal of the second memory cell transistor, and an emitter terminal of the first buffering transistor connected to a second constant current source and to the base terminal of the first memory cell transistor through a first resistor, and a base terminal of the second buffering transistor connected to a collector terminal of the first memory cell transistor, and an emitter terminal of the second buffering transistor connected to a third constant current source and to the base terminal of the second memory cell transistor through a second resistor, and complementary data output lines connected to the bases of the memory cell transistors.

2. A memory cell circuit comprising the latch of claim 1 and further comprising a pair of emitter-coupled data input/output transistors, coupled followers of said data input/output transistors connected to an input of one of a pair of emitter-coupled clock input/output transistors, coupled followers of said clock input/output transistors commonly connected to a fourth constant current source, and collectors of said data input/output transistors connected to bases of said memory cell transistors of the latch circuit.

3. A master-slave flip-flop circuit comprising at least two of the memory cells of claim 2 wherein a high clock output of a first memory cell is connected to a second memory cell for input as a low clock input to the second memory cell.

* * * * *